(12) United States Patent
Kobayashi et al.

(10) Patent No.: US 6,506,537 B2
(45) Date of Patent: Jan. 14, 2003

(54) RADIATION-SENSITIVE RESIN COMPOSITION

(75) Inventors: Eiichi Kobayashi, Yokkaichi (JP); Jun Numata, Yokkaichi (JP); Mikio Yamachika, Santa Clara, CA (US); Masafumi Yamamoto, Yokkaichi (JP)

(73) Assignee: JSR Corporation, Tokyo (JP)

( * ) Notice: Subject to any disclaimer, the term of this patent is extended or adjusted under 35 U.S.C. 154(b) by 15 days.

(21) Appl. No.: 09/878,274

(22) Filed: Jun. 12, 2001

(65) Prior Publication Data

US 2002/0012872 A1 Jan. 31, 2002

(30) Foreign Application Priority Data

Jun. 12, 2000 (JP) ........................................ 2000-176171
Jun. 13, 2000 (JP) ........................................ 2000-177487

(51) Int. Cl.⁷ .............................................. G03F 7/004
(52) U.S. Cl. ..................... 430/270.1; 326/905; 326/910
(58) Field of Search .............................. 430/270.1, 326, 430/905, 910

(56) References Cited

U.S. PATENT DOCUMENTS 6,066,433 A  5/2000 Takemura et al. ....... 430/270.1

FOREIGN PATENT DOCUMENTS

| EP | 0 930 541 A1 | 7/1999 |
| EP | 1 085 379 A1 | 3/2001 |
| EP | 1 122 605 A2 | 8/2001 |
| JP | 60-52845 | 3/1985 |
| JP | 60-191372 | 9/1985 |
| JP | 2-25850 | 1/1990 |

*Primary Examiner*—Rosemary Ashton
(74) *Attorney, Agent, or Firm*—Piper Rudnick, LLP; Steven B. Kelber

(57) ABSTRACT

A positive-type radiation-sensitive resin composition is provided. The composition includes:

(A) a low-molecular compound comprising a compound having at least one amino group having one or two hydrogen atom(s) bonded to the nitrogen atom; at least one hydrogen atom the amino group has having been substituted with a t-butoxycarbonyl group;

(B) a radiation-sensitive acid generator; and (C) a silicon-atom-containing resin comprising an alkali-insoluble or alkali-slightly-soluble resin having been protected with an acid-cleavable group; the resin being capable of turning soluble in alkali upon cleavage of the acid-cleavable group.

This radiation-sensitive resin composition is effectively responsive to radiations of various types, has superior sensitivity and resolution and also a superior long-term storage stability, and is useful as a positive-type chemically amplified resist.

18 Claims, No Drawings

RADIATION-SENSITIVE RESIN COMPOSITION

BACKGROUND OF THE INVENTION

1. Field of the Invention

This invention relates to a positive-type radiation-sensitive resin composition suited for ultrafine processing using radiations of various types such as ultraviolet radiations, far-ultraviolet radiations, X-radiations and charged-particle radiations.

2. Description of the Prior Art

In the field of fine processing as typified by the fabrication of integrated-circuit devices, the size of processing in lithography is being made finer in order to achieve a higher degree of integration. In recent years, there is a demand for techniques that enable fine processing in a line width of 0.5 μm or smaller in a good reproducibility. Accordingly, resists used therein are also required to enable formation of patterns of 0.5 μm or finer in a good precision. However, in conventional processes making use of visible radiations (wavelength: 800 to 400 nm) or near ultraviolet radiations (400 to 300 nm), it is very difficult to form fine patterns of 0.5 μm or finer in a high precision. Accordingly, extensive studies are made on radiations having a shorter wavelength (wavelength: 300 nm or shorter).

Radiations having such a short wavelength may include, e.g., mercury lamp bright-line (wavelength: 254 nm), far-ultraviolet radiations as typified by those of KrF excimer laser (wavelength: 248 nm), ArF excimer laser (wavelength: 193 nm) or $F_2$ excimer laser (wavelength: 157 nm), X-radiations such as synchrotron radiations (e.g., EUV lithography), and charged-particle radiations such as electron radiations. Among these, lithography making use of, in particular, excimer lasers has come to especially attract notice because of their characteristics ensuring a high output and a high efficiency. Accordingly, resists used in lithography are demanded to enable formation of fine patterns of 0.25 μm or finer in a high sensitivity and in a high resolution and a good reproducibility.

Then, as a resist suited for the far-ultraviolet radiations such as those of KrF excimer laser, "chemically amplified resist" is proposed in which a radiation-sensitive acid generator capable of forming an acid by irradiation with radiations (hereinafter "exposure") is used so that the sensitivity of a resist can be improved by the catalytic action of this acid.

Such chemically amplified resists include, e.g., as disclosed in Japanese Laid-open Publication (Kokai) No. 59-45439, a combination of a resin protected with a t-butyl group or a t-butoxycarbonyl group with a radiation-sensitive acid generator, and, as disclosed in Japanese Laid-open Publication (Kokai) No. 60-52845, a combination of a resin protected with a silyl group with a radiation-sensitive acid generator. Besides these, many reports are made on the chemically amplified resists such as a resist containing i) a resin having an acetal group and ii) a radiation-sensitive acid generator (Japanese Laid-open Publication (Kokai) No. 2-25850).

However, especially because of the design size having come to be 0.25 μm or finer, in the case of conventional single-layer chemically amplified resists, resist films formed may absorb radiations more greatly with an increase in layer thickness to maintain a high resolving performance with difficulty. On the other hand, films formed thin in order to improve resolving performance may have so insufficient a resistance to dry etching as to be not usable as masks for substrate processing. Thus, limitations of relying on trade-off of layer thickness have gradually come to be apparent. To solve this problem, in recent years, multilayer-type resist materials suited for lithographic techniques making use of KrF excimer laser or ArF excimer laser are being energetically brought to a more advance state (Proc. SPIE, Vol. 3333). As resist film materials for upper layers of such multilayer resist films, usually used are photosensitive films which contain silicon atoms, having a high resistance to dry etching. Resist films thus formed, containing silicon atoms, have a characteristic feature that they have so high a resistance to etching as to be usable in the form of thin films and hence any absorption of radiations by resist films can be kept small and good-shape patterns can be obtained in a high resolution. However, these resists have had a problem that they may greatly change with time in sensitivity when stored over a long period of time and are not suitable for the long-term storage of stocks that is necessary when devices are mass-produced.

SUMMARY OF THE INVENTION

An object of the present invention is to provide a radiation-sensitive resin composition which is effectively responsive to radiations of various types, has superior sensitivity and resolution and also a superior long-term storage stability, and further which is also useful as an upper-layer resist in processing making use of positive-type chemically amplified multilayer resist films.

According to the present invention, the above object can be achieved by a positive-type radiation-sensitive resin composition comprising:

(A) a low-molecular compound having at least one amino group having one or two hydrogen atoms bonded to a nitrogen atom wherein at least one hydrogen atom of said hydrogen atoms has been substituted with a t-butoxycarbonyl group;

(B) a radiation-sensitive acid generator; and (C) an alkali-insoluble or alkali-slightly-soluble silicon-atom-containing resin having been protected with an acid-cleavable group, the resin being capable of turning alkali-soluble upon cleavage of the acid-cleavable group.

DESCRIPTION OF THE PREFERRED EMBODIMENTS

The present invention will be described below in detail. Herein, "(meth)acrylic", "(meth)acryloyl", (meth)acrylate, or the like generically includes "acrylic and methacrylic", "acryloyl and methacryloyl", "acrylate and methacrylate" or the like, respectively.

The radiation-sensitive resin composition of the present invention consists basically of a component (A) a compound containing a substituted amino group (substituted-amino-group-containing compound), a component (B) a radiation-sensitive acid generator, and a component (C) a resin containing an acid-cleavable group (acid-cleavable-group-containing resin).

(A) Substituted-amino-group-containing Compound

The compound of the component (A) [hereinafter "component-(A) compound"] in the present invention is a low-molecular compound derived from a compound having at least one amino group having one or two hydrogen atom(s) bonded to a nitrogen atom [hereinafter "amino compound (a)]. That is, The component (A) low molecular compound is formed by substitution of at least one hydrogen atom of said hydrogen atom(s) of the amino group with a t-butoxycarbonyl group.

The amino compound (a) may, in other words, be any of those having a hydrogen atom bonded to nitrogen (i.e., N—H bond), without limitations to its form of existence. One hydrogen atom may be bonded to a nitrogen atom or two hydrogen atoms may be bonded to the same nitrogen atom. More specifically, the amino group of the amino compound (a) is meant to be what is called a primary amino group or a secondary amino group. This amino group has no limitations on its adjoining atom or group, and may be bonded adjoiningly to, e.g., a carbonyl group or a thiocarbonyl group.

Where the amino compound (a) has two or more amino groups and also has two or more t-butoxycarbonyl groups, each t-butoxycarbonyl group may be bonded to the same or different nitrogen atom.

In radiation-sensitive resin compositions used as chemically amplified resists, it is known that the incorporation of an acid diffusion control agent having the action to control a phenomenon where the acid generated from the radiation-sensitive acid generator upon exposure diffuses into resist films and to control any unwanted chemical reaction in unexposed areas brings about an improvement in storage stability of the resin compositions and an improvement in resolution as resists and also can keep resist pattern line width from changing because of variations of a post-exposure delay (PED) of from exposure to developing treatment, promising a very good processing stability.

As a result of extensive studies made on the acid diffusion control agent used in radiation-sensitive resin compositions containing radiation-sensitive acid generators, the present inventors have discovered that the use of a low-molecular compound a basic amino group of which has been protected with an acid-cleavable t-butoxycarbonyl group brings about a great improvement in various performances required for resist materials to be used as upper layers of multilayer resist films, thus they have accomplished the present invention.

The amino compound (a) may include, e.g., compounds represented by the following formula (1):

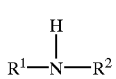

(1)

[In the formula (1), $R^1$ and $R^2$ each independently represent a hydrogen atom or a monovalent organic group, provided that $R^1$ and $R^2$ are not hydrogen atoms at the same time] (hereinafter "nitrogen-containing compound (I)"), compounds having two nitrogen atoms in the same molecule (hereinafter "nitrogen-containing compound (II)"), compounds having three or more nitrogen atoms (hereinafter "nitrogen-containing compound (III)"), amide-group-containing compounds, urea compounds, and nitrogen-containing heterocyclic compounds.

The nitrogen-containing compound (I) may include, e.g., monoalkylamines such as n-hexylamine, n-heptylamine, n-octylamine, n-nonylamine, n-decylamine and cyclohexylamine; dialkylamines such as di-n-butylamine, di-n-pentylamine, di-n-hexylamine, di-n-heptylamine, di-n-octylamine, di-n-nonylamine, di-n-decylamine, cyclohexylmethylamine and dicyclohexylamine; aromatic amines such as aniline, N-methylaniline, 2-methylaniline, 3-methylaniline, 4-methylaniline, 4-nitroaniline, diphenylamine, 1-naphthylamine, 2-(4-aminophenyl)-2-(3-hydroxyphenyl)propane and 2-(4-aminophenyl)-2-(4-hydroxyphenyl)propane; alkanolamines such as ethanolamine and diethanolamine; and 1-adamantylamine and N-methyl-1-adamantylamine.

The nitrogen-containing compound (II) may include, e.g., ethylenediamine, tetramethylenediamine, hexamethylenediamine, 1,7-diaminoheptane, 1,8-diaminooctane, 1,9-diaminononane, 1,10-diaminodecane, 1,12-diaminododecane, 4,4'-diaminophenylmethane, 4,4'-diaminodiphenylether, 4,4'-diaminobenzophenone, 2,2'-bis(4-aminophenyl)propane, 2-(3-aminophenyl)-2-(4-aminophenyl)propane, 1,4-bis[1-(4-aminophenyl)-1-methylethyl]benzene and 1,3-bis[1-(4-aminophenyl)-1-methylethyl]benzene.

The nitrogen-containing compound (III) may include, e.g., polymers such as 4,4'-diaminodiphenylamine, polyallylamine, polymethallylamine and N-(2-aminoethyl)acrylamide.

The amide-group-containing compounds may include, e.g., formamide, N-methylformamide, acetamide, N-methylacetamide, propionamide, benzamide and pyrrolidone.

The urea compounds may include, e.g., urea, methylurea, 1,1-dimethylurea, 1,3-dimethylurea, 1,3-diphenylurea and tri-n-butylthiourea.

The nitrogen-containing heterocyclic compounds may include, e.g., imidazoles such as imidazole, benzimidazole, 2-methylimidazole, 4-methylimidazole, 2-phenylimidazole, 4-phenylimidazole, 2-phenyl-4-methylimidazole, 2-methyl-4-phenylimidazole, 2-methylbenzimidazole and 2-phenylbenzimidazole; and besides indole, pyrrole, pyrazole, adenine, guanine, purine, pyrrolidine, piperidine, morpholine and piperadine.

Of these amino compounds (a), the nitrogen-containing compound (I), the nitrogen-containing compound (II) and the nitrogen-containing heterocyclic compounds are preferred. Also, of the nitrogen-containing compound (I), dialkylamines and 1-adamantylamines are more preferred, and di-n-octylamine, di-n-nonylamine, di-n-decylamine, dicyclohexylamine, 1-adamantylamine and N-methyl-1-adamantylamine are particularly preferred. Of the nitrogen-containing compound (II), hexamethylenediamine, 1,7-diaminoheptane, 1,8-diaminooctane, 1,9-diaminononane, 1,10-diaminodecane, 1,12-diaminododecane and 4,4'-diaminodiphenylmethane are more preferred. Of the nitrogen-containing heterocyclic compounds, imidazoles are more preferred, and benzimidazole, 2-methylimidazole and 2-phenylbenzimidazole are particularly preferred.

The conjugate acid of the amino compound (a) preferably has a pKa (measurement temperature: 25° C.; the same applies hereinafter) of 0 or more. If a compound of which the conjugate acid has a pKa of less than 0 as exemplified by an imide compound is used in place of the amino compound (a), the resolution and pattern shape of the resultant resist may be damaged.

As particularly preferred examples, the component-(A) compound may specifically include N-t-butoxycarbonyldi-n-octylamine, N-t-butoxycarbonyldi-n-nonylamine, N-t-butoxycarbonyldi-n-decylamine, N-t-butoxycarbonyldicylcohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t- butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole and N-t-butoxycarbonyl-2-phenylbenzimidazole.

The component-(A) compound may usually have a molecular weight of from 100 to 3,000, preferably from 200 to 2,000, and particularly preferably from 250 to 1,000.

In the present invention, the component-(A) compound may be used alone or in the form of a mixture of two or more types.

(B) Radiation-sensitive Acid Generator

The component (B) in the present invention is a radiation-sensitive acid generator capable of generating an acid upon exposure (hereinafter "component-(B) acid generator").

The component-(B) acid generator may include onium salt compounds, sulfone compounds, sulfonate compounds, sulfonimide compounds, diazomethane compounds and disulfonylmethane compounds.

Examples of these component-(B) acid generators are shown below.

Onium Compound

The onium compound may include, e.g., iodonium salts, sulfonium salts (inclusive of tetrahydrothiophenium salts), phosphonium salts, diazonium salts, ammonium salts and pyridinium salts.

As specific examples of the onium salt compound, it may include;
bis(4-t-butylphenyl)iodonium trifluoromethanesulfonate, bis(4-t-butylphenyl)iodonium nonafluoro-n-butanesulfonate, bis(4-t-butylphenyl)iodonium pyrenesulfonate, bis(4-t-butylphenyl)iodonium n-dodecylbenzenesulfonate, bis(4-t-butylphenyl) iodonium p-toluenesulfonate, bis(4-t-butylphenyl) iodonium benzenesulfonate, bis(4-t-butylphenyl) iodonium 10-camphor sulfonate, bis(4-t-butylphenyl) iodonium n-octanesulfonate, bis(4-t-butylphenyl) iodonium 2-trifluoromethylbenzenesulfonate, bis(4-t-butylphenyl)iodonium 4-trifluoromethylbenzenesulfonate, bis(4-t-butylphenyl) iodonium 2,4-difluorobenzenesulfonate;
diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphor sulfonate, diphenyliodonium n-octanesulfonate, diphenyliodonium 2-trifluoromethylbenzenesulfonate, diphenyliodonium 4-trifluoromethylbenzenesulfonate, diphenyliodonium 2,4-difluorobenzenesulfonate;
triphenylsulfonium trifluoromethanesulfonate, triphenylsulfonium nonafluoro-n-butanesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphor sulfonate, triphenylsulfonium n-octanesulfonate, triphenylsulfonium 2-trifluoromethylbenzenesulfonate, triphenylsulfonium 4-trifluoromethylbenzenesulfonate, triphenylsulfonium 2,4-difluorobenzenesulfonate, triphenylsulfonium hexafluoroantimonate, triphenylsulfonium 1-napthalenesulfonate;
4-t-butylphenyl diphenylsulfonium trifluoromethanesulfonate, 4-t-butylphenyl diphenylsulfonium nonafluoro-n-butanesulfonate, 4-t-butylphenyl diphenylsulfonium pyrenesulfonate, 4-t-butylphenyl diphenylsulfonium n-dodecylbenzenesulfonate, 4-t-butylphenyl diphenylsulfonium p-toluenesulfonate, 4-t-butylphenyl diphenylsulfonium benzenesulfonate, 4-t-butylphenyl diphenylsulfonium 10-camphor sulfonate, 4-t-butylphenyl diphenylsulfonium n-octanesulfonate, 4-t-butylphenyl diphenylsulfonium 2-trifluoromethylbenzenesulfonate, 4-t-butylphenyl diphenylsulfonium 4-trifluoromethylbenzenesulfonate, 4-t-butylphenyl diphenylsulfonium 2,4-difluorobenzenesulfonate;
4-t-butoxylphenyl diphenylsulfonium nonafluoro-n-butanesulfonate, and 4-hydroxylphenyl benzyl methylsulfonium p-toluenesulfonate.

Sulfone Compound

The sulfone compound may include, e.g., β-ketosulfone, β-sulfonylsulfone, and α-diazo compounds of these.

As specific examples of the sulfone compound, it may include phenacyl phenyl sulfone, mesityl phenacyl sulfone, bis(phenylsulfonyl)methane and 4-trisphenacyl sulfone.

Sulfonate Compound

The sulfonate compound may include, e.g., alkyl sulfonates, haloalkyl sulfonates, aryl sulfonates and imino sulfonates.

As specific examples of the sulfonate compound, it may include benzoin tosylate, pyrogallol tris (trifluoromethanesulfonate), pyrogallol tris(nonafluoro-n-butanesulfonate), pyrogallol tris(methanesulfonate), nitrobenzyl-9,10-diethoxyanthracene-2-sulfonate, α-methylol benzoin tosylate, α-methylol benzoin n-octanesulfonate, α-methylol benzoin trifluoromethanesulfonate, and α-methylol benzoin n-dodecanesulfonate.

Sulfonimide Compound

The sulfonimide compound may include, e.g., compounds represented by the following formula (2):

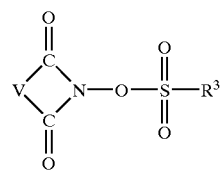

wherein in the formula (2), V represents a divalent group such as an alkylene group, an arylene group or an alkoxylene group, and $R^3$ represents a monovalent group such as an alkyl group, an aryl group, a halogen-substituted alkyl group or a halogen-substituted aryl group.

As specific examples of the sulfonimide compound, it may include;
N-(trifluoromethanesulfonyloxy)succinimide, N-(trifluoromethanesulfonyloxy)phthalimide, N-(trifluoromethanesulfonyloxy)diphenylmaleimide, N-(trifluoromethanesulfonyloxy)bicyclo[2.2.1]hepto-5-ene-2,3-dicarboxyimide, N-(trifluoromethanesulfonyloxy)-7-oxabicyclo[2.2.1]hepto-5-ene-2, 3-dicarboxyimide, N-(trifluoromethanesulfonyloxy)bicyclo[2.2.1]heptan-5,6-oxy-2,3-dicarboxyimide, N-(trifluoromethanesulfonyloxy)naphthylimide;
N-(10-camphorsulfonyloxy)succinimide, N-(10-camporsulfonyloxy)phthalimide, N-(10- camporsulfonyloxy)diphenylmaleimide, N-(10-camphorsulfonyloxy)bicyclo[2.2.1]hepto-5-ene-2,3-dicarboxyimide, N-(10-camphorsulfonyloxy)-7-oxabicyclo[2.2.1]hepto-5-ene-2,3-dicarboxyimide, N-(10-camphorsulfonyloxy)bicyclo[2.2.1]heptan-5,6-oxy-2,3-dicarboxyimide, N-(10-camphorsulfonyloxy)naphthylimide;

N-(p-toluenesulfonyloxy)succinimide, N-(p-toluenesulfonyloxy)phthalimide, N-(p-toluenesulfonyloxy)diphenylmaleimide, N-(p-toluenesulfonyloxy)bicyclo[2.2.1]hepto-5-ene-2,3-dicarboxyimide, N-(p-toluenesulfonyloxy)-7-oxabicyclo[2.2.]hepto-5-ene-2,3-dicarboxyimide, N-(p-toluenesulfonyloxy)bicyclo[2.2.1]heptan-5,6-oxy-2,3-dicarboxyimide, N-(p-toluenesulfonyloxy)naphthylimide;

N-(2-trifluoromethylbenzenesulfonyloxy)succinimide, N-(2-trifluoromethylbenzenesulfonyloxy)phthalimide, N-(2-trifluoromethylbenzenesulfonyloxy)diphenylmaleimide, N-(2-trifluoromethylbenzenesulfonyloxy)bicyclo[2.2.1]hepto-5-ene-2,3-dicarboxyimide, N-(2-trifluoromethylbenzenesulfonyloxy)-7-oxabicyclo[2.2.1]hepto-5-ene-2,3-dicarboxyimide, N-(2-trifluoromethylbenzenesulfonyloxy)bicyclo[2.2.1]heptan-5,6-oxy-2,3-dicarboxyimide, N-(2-trifluoromethylbenzenesulfonyloxy)naphthylimide;

N-(4-trifluoromethylbenzenesulfonyoxy)succinimide, N-(4-trifluoromethylbenzenesulfonyloxy)phthalimide, N-(4-trifluoromethylbenzenesulfonyloxy)diphenylmaleimide, N-(4-trifluoromethylbenzenesulfonyloxy)bicyclo[2.2.1]hepto-5-ene-2,3-dicarboxyimide, N-(4-trifluoromethylbenzenesulfonyloxy)-7-oxabicyclo[2.2.1]hepto-5-ene-2,3-dicarboxymide, N-(4-trifluoromethylbenzenesulfonyloxy)bicyclo[2.2.1]heptan-5,6-oxy-2,3-dicarboxyimide, N-(4-trifluoromethylbenzenesulfonyloxy)naphthylimide;

N-(nonafluoro-n-butanesulfonyloxy)succinimide, N-(nonafluoro-n-butanesulfonyloxy)phthalimide, N-(nonafluoro-n-butanesulfonyloxy)diphenylmaleimide, N-(nonafluoro-n-butanesulfonyloxy)bicyclo[2.2.1]hepto-5-ene-2,3-dicarboxyimide, N-(nonafluoro-n-butanesulfonyloxy)-7-oxabicyclo[2.2.1]hepto-5-ene-2,3-dicarboxyimide, N-(nonafluoro-n-butanesulfonyloxy)bicyclo[2.2.1]heptan-5,6-oxy-2,3-dicarboxyimide, N-(nonafluoro-n-butanesulfonyloxy)naphthylimide;

N-(pentafluorobenzenesulfonyloxy)succinimide, N-(pentafluorobenzenesulfonyloxy)phthalimide, N-(pentafluorobenzenesulfonyloxy)diphenylmaleimide, N-(pentafluorobenzenesulfonyloxy)bicyclo[2.2.1]hepto-5-ene-2,3-dicarboxyimide, N-(pentafluorobenzenesulfonyloxy)-7-oxabicyclo[2.2.1]hepto-5-ene-2,3-dicarboxyimide, N-(pentafluorobenzenesulfonyloxy)bicyclo[2.2.1]heptan-5,6-oxy-2,3-dicarboxyimide, N-(pentafluorobenzenesulfonyloxy)naphthylimide;

N-(perfluoro-n-octanesulfonyloxy)succinimide, N-(perfluoro-n-octanesulfonyloxy)phthalimide, N-(perfluoro-n-octanesulfonyloxy)diphenylmaleimide, N-(perfluoro-n-octanesulfonyloxy)bicyclo[2.2.1]hepto-5-ene-2,3-dicarboxyimide, N-(perfluoro-n-octanesulfonyloxy)-7-oxabicyclo[2.2.1]hepto-5-ene-2,3-dicarboxyimide, N-(perfluoro-n-octanesulfonyloxy)bicyclo[2.2.1]heptan-5,6-oxy-2,3-dicarboxyimide, N-(perfluoro-n-octanesulfonyloxy)naphthylimide; and N-{(5-methyl-5-carboxymethanebicyclo[2.2.1]heptan-2-yl)sulfonyloxy}succinimide.

Diazomethane Compound

The diazomethane compound may include, e.g., compounds represented by the following formula (3).

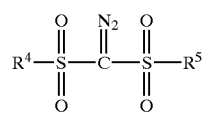

(3)

wherein in the formula (3), $R^4$ and $R^5$ each independently represent a monovalent group such as an alkyl group, an aryl group, a halogen-substituted alkyl group or a halogen-substituted aryl group.

As specific examples of the diazomethane compound, it may include bis(trilfluoromethanesulfonyl)diazomethane, bis(cyclohexanesulfonyl)diazomethane, bis(benzenesulfonyl)diazomethane, bis(p-toluenesulfonyl)diazomethane, methanesulfonyl-p-toluenesulfonyldiazomethane), cyclohexanesulfonyl-1,1-dimethylethylsulfonyldiazomethane, bis(1,1-dimethylethanesulfonyldiazomethane, bis(3,3-dimethyl-1,5-dioxaspiro[5.5]dodecane-8-sulfonyl)diazomethane, and bis(1,4-dioxaspiro[4.5]decane-7-sulfonyl)diazomethane.

Disulfonylmethane Compound

The disulfonylmethane compound may include, e.g., compounds represented by the following formula (4).

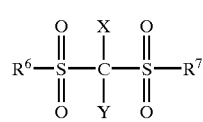

(4)

wherein in the formula (4), $R^6$ and $R^7$ each independently represent a straight-chain or branched monovalent aliphatic hydrocarbon group, a cycloalkyl group, an aryl group, an aralkyl group, or a monovalent other organic group having a hetero atom; X and Y each independently represent an aryl group, a hydrogen atom, a straight-chain or branched monovalent aliphatic hydrocarbon group, or a monovalent other organic group having a hetero atom, and at least one of X and Y is an aryl group, or X and Y combine with each other to form a monocyclic or polycyclic group having at least one unsaturated bond, or X and Y combine with each other to form a group represented by the following formula:

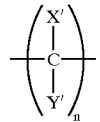

wherein X' and Y' each independently represent a hydrogen atom, a halogen atom, a straight-chain or branched alkyl group, a cycloalkyl group, an aryl group or an aralkyl group, or X' and Y' which are bonded to the same or different carbon atom(s) combine with each other to form a carbon monocyclic structure, and X' and Y' each existing in plurality may be the same with or different from each other; and n is an integer of 2 to 10.

As the component-(B) acid generator, the onium compound and the sulfonimide compound are preferred. It is particularly preferred to use at least one member selected from the group consisting of bis(4-t-butylphenyl)iodonium trifluoromethanesulfonate, bis(4-t-butylphenyl)iodonium perfluoro-n-butanesulfonate, bis(4-t-butylphenyl)iodonium p-toluenesulfonate, bis(4-t-butylphenyl)iodonium 10-camphor sulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl)iodonium 2,4-difluorobenzenesulfonate, triphenylsulfonium trifluoromethanesulfonate, triphenylsulfonium perfluoro-n-butanesulfonate, triphenylsulfonium triphenylsulfonium p-toluenesulfonate, triphenylsulfonium 10-camphor sulfonate, triphenylsulfonium 2-trifluoromethylbenzenesulfonate, triphenylsulfonium 4-trifluoromethylbenzenesulfonate, triphenylsulfonium 2,4-difluorobenzenesulfonate, N-(trifluoromethanesulfonyloxy)succinimide, N-(trifluoromethanesulfonyloxy)bicyclo[2.2.1]hepto-5-ene-2,3-dicarboxyimide, N-(10-camphorsulfonyloxy)succinimide, N-(10-camphorsulfonyloxy)bicyclo[2.2.1]hepto-5-ene-2,3-dicarboxyimide, and N-{(5-methyl-5-carboxymethanebicyclo[2.2.1]heptan-2-yl)sulfonyloxy}succinimide.

(C) Acid-cleavable-group-containing Resin

The component (C) used in the present invention is an alkali-insoluble or alkali-slightly-soluble silicon-containing resin having been protected with an acid-cleavable group; the resin being capable of turning soluble in alkali upon cleavage of the acid-cleavable group (hereinafter "component-(C) acid-cleavable-group-containing resin"). More specifically, this component-(C) acid-cleavable-group-containing resin contains at least one acidic functional group such as a phenolic hydroxyl group or a carboxyl group, having been protected with an acid-cleavable group, and also contains a silicon atom. This resin is described below in greater detail.

The component-(C) acid-cleavable-group-containing resin is firstly characterized in that it is a silicon-atom-containing resin having been formed by substituting a hydrogen atom of an acidic functional group contained in an alkali-soluble resin containing at least one repeating unit selected from the group consisting of the units represented by the following formulas (5) to (8):

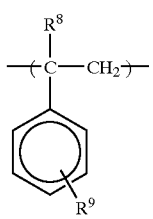
(5)

wherein in the formula (5), $R^8$ represents a hydrogen atom or a methyl group, $R^9$ represents a hydroxyl group, a carboxyl group, $—R^{10}COOH$, $—OR^{10}COOH$, $—OCOR^{10}COOH$ or $—COOR^{10}COOH$ (wherein $R^{10}$ represents $(CH_2)_g—$, where g represents an integer of 1 to 4),

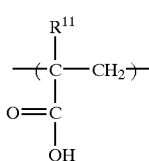
(6)

wherein in the formula (6), $R^{11}$ represents a hydrogen atom or a methyl group,

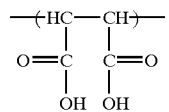
(7)

and,

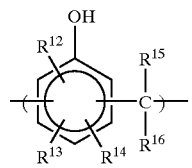
(8)

wherein in the formula (8), $R^{12}$ to $R^{16}$ each independently represent a hydrogen atom or an alkyl group having 1 to 4 carbon atoms, with at least one acid-cleavable group which is capable of cleaving in the presence of an acid.

The acid-cleavable group in the component-(C) acid-cleavable-group-containing resin may include, e.g., a substituted methyl group, a 1-substituted ethyl group, a 1-substituted n-propyl group, a 1-branched alkyl group, a silyl group, a germyl group, an alkoxycarbonyl group, an acyl group and a cyclic acid-cleavable group.

The substituted methyl group may include, e.g., a methoxymethyl group, a methylthiomethyl group, an ethoxymethyl group, an ethylthiomethyl group, a methoxyethoxymethyl group, a benzyloxymethyl group, a benzylthiomethyl group, a phenacyl group, a 4-bromophenacyl group, a 4-methoxyphenacyl group, a 4-methylthioyphenacyl group, an α-methylphenacyl group, a cyclopropylmethyl group, a benzyl group, a diphenylmethyl group, a triphenylmethyl group, a 4-bromobenzyl group, a 4-nitrobenzyl group, a 4-methoxybenzyl group, a 4-methylthiobenzyl group, a 4-ethoxybenzyl group, a 4-ethylthiobenzyl group, a piperonyl group, a methoxycarbonylmethyl group, an ethoxycarbonylmethyl group, a n-propoxycarbonylmethyl group, an i-propoxycarbonylmethyl group, a n-butoxycarbonylmethyl group and a t-butoxycarbonylmethyl group.

The 1-substituted ethyl group may include, e.g., a 1-methoxyethyl group, a 1-methylthioethyl group, a 1,1-dimethoxyethyl group, a 1-ethoxyethyl group, a 1-ethylthioethyl group, a 1,1-diethoxyethyl group, a 1-phenoxyethyl group, a 1-phenylthioethyl group, a 1,1-diphenoxyethyl group, a 1-benzyloxyethyl group, a 1-benzylthioethyl group, a 1-cyclopropylethyl group, a 1-cyclohexyloxyethyl group, a 1-phenylethyl group, a 1,1-diphenylethyl group, a 1-methoxycarbonylethyl group, a 1-ethoxycarbonylethyl group, a 1-n-propoxycarbonylethyl group, a 1-i-propoxycarbonylethyl group, a 1-n-butoxycarbonylethyl group and a 1-t-butoxycarbonylethyl group.

The 1-substituted n-propyl group may include, e.g., a 1-methoxy-n-propyl group and a 1-ethoxy-n-propyl group.

The 1-branched alkyl group may include, e.g., an i-propyl group, a sec-butyl group, a t-butyl group, a 1,1-dimethylpropyl group, a 1-methylbutyl group and a 1,1-dimethylbutyl group.

The silyl group may include, e.g., a trimethylsilyl group, an ethyldimethylsilyl group, a methyldiethylsilyl group, a triethylsilyl group, an i-propyldimethylsilyl group, a methyldi-i-propylsilyl group, a tri-i-propylsilyl group, a t-butyldimethylsilyl group, a methyldi-t-butylsilyl group, a tri-t-butylsilyl group, a phenyldimethylsilyl group, a methyldiphenylsilyl group and a triphenylsilyl group.

The germyl group may include, e.g., a trimethylgermyl group, an ethyldimethylgermyl group, a methyldiethylgermyl group, a triethylgermyl group, an i-propyldimethylgermyl group, a methyldi-i-propylgermyl group, a tri-i-propylgermyl group, a t-butyldimethylgermyl group, a methyldi-t-butylgermyl group, a tri-t-butylgermyl group, a phenyldimethylgermyl group, a methyldiphenylgermyl group and a triphenylgermyl group.

The alkoxycarbonyl group may include, e.g., a methoxycarbonyl group, an ethoxycarbonyl group, an i-propxycarbonyl group and a t-butoxycarbonyl group.

The acyl group may include, e.g., an acetyl group, a propionyl group, a butyryl group, a heptanoyl group, a hexanoyl group, a valeryl group, a pivaloyl group, an isovaleryl group, a lauroyl group, a myristoyl group, a palmitoyl group, a stearoyl group, an oxalyl group, a malonyl group, a succinyl group, a glutaryl group, an adipoyl group, a piperoyl group, a suberoyl group, a azelaoyl group, a sebacoyl group, an acryloyl group, a propioloyl group, a methacryloyl group, a chloronoyl group, an oleoyl group, a maleoyl group, a fumaroyl group, a methaconoyl group, a camphoroyl group, a benzoyl group, a phthaloyl group, an isophthaloyl group, a terephthaloyl group, a naphthoyl group, a toluoyl group, a hydroatropoyl group, an atropoyl group, a cinnamoyl group, a furoyl group, a thenoyl group, a nicotinoyl group, an isonicotinoyl group, a p-toluenesulfonyl group and a mesyl group.

The cyclic acid-cleavable group may include, e.g., a cyclopropyl group, a cyclopentyl group, a cyclohexyl group, a cyclohexenyl group, a 4-methoxycyclohexenyl group, a tetrahydropyranyl group, a tetrahydrofuranyl group, a tetrahydrothiopyranyl group, a tetrahydrothiofuranyl group, a 3-bromotetrahydropyranyl group, a 4-methoxytetrahydropyranyl group, a 4-methoxytetrahydrothiopyranyl group and a 3-tetrahydrothiophene-1,1-dioxide group.

Of these the acid-cleavable groups, a benzyl group, a t-butoxyethyl group, a 1-methoxyethyl group, a 1-ethoxyethyl group, a 1-cyclohexyloxyethyl group, a 1-ethoxy-n-propyl group, a t-butyl group, a 1,1-dimethylpropyl group, a trimethylsilyl group, a t-butoxycarbonyl group, a tetrahydropyranyl group, a tetrahydrofuranyl group, a tetrahydrothiopyranyl group and a tetrahydrothiofuranyl group are preferred.

The proportion of the acid-cleavable group in the component-(C) acid-cleavable-group-containing resin (i.e., the proportion of the number of acid-cleavable groups to the total number of acidic functional groups and acid-cleavable groups in the component-(C) acid-cleavable-group-containing resin) depends on the types of the acid-cleavable group and the alkali-soluble resin into which the group is to be introduced, and can not absolutely be defined. It may preferably be from 5 to 100%, and more preferably from 10 to 100%.

The component-(C) acid-cleavable-group-containing resin is secondly characterized in that it always contains a silicon atom. The silicon atom is introduced into the resin by using a monomer containing a silicon atom. The proportion of silicon atoms in the component-(C) acid-cleavable-group-containing resin (i.e., the proportion of the weight of silicon atoms to the weight of the acid-cleavable resin) depends on the types of the acid-cleavable group and the alkali-soluble resin into which the group is to be introduced, and can not absolutely be defined. It may preferably be from 0.1 to 30% by weight, more preferably from 0.5 to 25% by weight, and particularly preferably from 1 to 20% by weight.

Production

The component-(C) acid-cleavable-group-containing resin may be produced by, e.g., (1) a method in which at least one acid-cleavable group is introduced in a silicon-atom-containing alkali-soluble resin produced previously, (2) a method in which at least one polymerizable unsaturated monomer having an acid-cleavable group is subjected to polymerization or copolymerization optionally together with at least one other polymerizable unsaturated monomer having no acid-cleavable group, and (3) a method in which at least one polycondensation component having an acid-cleavable group is subjected to polycondensation or copolycondensation optionally together with at least one other polycondensation component having no acid-cleavable group.

In the case of the method (2), a monomer containing a silicon atom may be used as at least one of the polymerizable unsaturated monomer having an acid-cleavable group and the polymerizable unsaturated monomer having no acid-cleavable group or used in addition to these, whereby silicon atoms can be introduced into the resultant component-(C) acid-cleavable-group-containing resin. In the case of the method (3), too, a component containing a silicon atom may be used as at least one of the polycondensation component having an acid-cleavable group and the polycondensation component having no acid-cleavable group or used in addition to these, whereby silicon atoms can be introduced into the resultant component-(C) acid-cleavable-group-containing resin.

Usable monomer components are described below.

The silicon-free polymerizable unsaturated monomer having an acid-cleavable group may include compounds obtained by substituting with the acid-cleavable group the hydrogen atom of a phenolic hydroxyl group or carboxyl group in the monomer corresponding to any of the above repeating units represented by the formulas (5) to (7).

The silicon-free polymerizable unsaturated monomer having no acid-cleavable group may include styrene, α-methylstyrene, maleic anhydride, (meth)acrylonitrile, crotononitrile, maleinonitrile, fumaronitrile, mesacononitrile, citracononitrile, itacononitrile, (meth)acrylamide, crotonamide, maleinamide, fumaramide, mesaconamide, citraconamide, itaconamide, vinylaniline, vinylpyridine, vinyl-ε-caprolactum, vinylpyrrolidone and vinylimidazole.

The polycondensation component having an acid-cleavable group may include, e.g., compounds obtained by substituting with the acid-cleavable group the hydrogen atom of a phenolic hydroxyl group in the polycondensation component corresponding to the above repeating unit represented by the formula (8).

The silicon-atom-containing polymerizable monomer having an acid-cleavable group may typically include substituted silyl-group-containing styrene compounds, substituted silyl(meth)acrylate compounds and substituted silylalkyl(meth)acrylate compounds, all of these compounds having an acid-cleavable group. Besides, silane compounds and siloxane compounds both having a polymerizable unsaturated groups such as a vinyl group or an allyl group together with the acid-cleavable group may also be used.

The substituted silyl-group-containing styrene compounds may include, e.g., 4-trimethylsilyloxystyrene, 3-trimethylsilyloxystyrene, 2-trimethylsilyloxystyrene, 4-ethyldimethylsilyloxystyrene, 3-ethyldimethylsilyloxystyrene, 2-ethyldimethylsilyloxystyrene, 4-methyldiethylsilyloxystyrene, 3-methyldiethylsilyloxystyrene, 2-methyldiethylsilyloxystyrene, 4-triethylsilyloxystyrene, 3-triethylsilyloxystyrene, 2-triethylsilyloxystyrene, 4-i-propyldimethylsilyloxystyrene, 3-i-propyldimethylsilyloxystyrene, 2-i-propyldimethylsilyloxystyrene, 4-methyldi-i-propylsilyloxystyrene, 3-methyldi-i-propylsilyloxystyrene, 2-methyldi-i-propylsilyloxystyrene, 4-tri-i-propylsilyloxystyrene, 4-t-butyldimethylsilyloxystyrene, 3-t-butyldimethylsilyloxystyrene. 2-t-butyldimethylsilyloxystyrene, 4-methyldi-t-butylsilyloxystyrene, 3-methyldi-t-butylsilyloxystyrene, 2-methyldi-t-butylsilyloxystyrene, 4-tri-t-butylsilyloxystyrene, 3-tri-t-butylsilyloxystyrene, 2-tri-t-butylsilyloxystyrene, 4-phenyldimethylsilyloxystyrene, 3-phenyldimethylsilyloxystyrene, 2-phenyldimethylsilyloxystyrene, 4-methyldiphenylsilyloxystyrene, 3-methyldiphenylsilyloxystyrene, 2-methyldiphenylsilyloxystyrene, 4-triphenylsilyloxystyrene, 3-triphenylsilyloxystyrene, 2-triphenylsilyloxystyrene, 4-tris(trimethylsilyl)silyloxystyrene, 4-tris(trimethoxysilyl)silyloxystyrene, 4-mono(trimethylsilyl)dimethylsilyloxystyrene, and 4-mono(trimethoxysilyl)dimethylsilyloxystyrene.

The substituted silyl(meth)acrylate compounds may include, e.g., trimethylsilyl (meth)acrylate, ethyldimethylsilyl (meth)acrylate, methyldiethylsilyl (meth)acrylate, triethylsilyl (meth)acrylate, i-propyldimethylsilyl (meth)acrylate, methyldi-i-propylsilyl (meth)acrylate, tri-i-propylsilyl (meth)acrylate, t-butyldimethylsilyl (meth)acrylate, methyldi-t-butylsilyl (meth)acrylate, tri-t-butylsilyl (meth)acrylate, phenyldimethylsilyl (meth)acrylate, methyldiphenylsilyl (meth)acrylate, triphenylsilyl (meth)acrylate, trimethylsilyldimethylsilyl (meth)acrylate, trimethoxysilyldimethylsilyl (meth)acrylate, tris(trimethylsilyl)silyl (meth)acrylate, tris(trimethoxysilyl)silyl (meth)acrylate, and tris(triphenylsilyl)silyl (meth)acrylate.

The substituted silylalkyl(meth)acrylate compounds may include, e.g., β-trimethylsilylethyl (meth)acrylate, β-(ethyldimethylsilyl)ethyl (meth)acrylate, β-(methyldiethylsilyl)ethyl (meth)acrylate, β-(triethylsilyl)ethyl (meth)acrylate, β-(i-propyldimethylsilyl)ethyl (meth)acrylate, β-(methdyldi-i-propylsilyl)ethyl (meth)acrylate, β-(tri-i-propylsilyl)ethyl (meth)acrylate, β-(t-butyldimethylsilyl )ethyl (meth)acrylate, β-(methdyldi-t-butylsilyl)ethyl (meth)acrylate, β-(tri-t-butylsilyl)ethyl (meth)acrylate, β-(phenyldimethylsilyl)ethyl (meth)acrylate, β-(methyldiphenylsilyl)ethyl (meth)acrylate, β-(triphenylsilyl)ethyl (meth)acrylate, β-tris(trimethylsilyl)silylethyl (meth)acrylate, β-tris(trimethoxysilyl)silylethyl (meth)acrylate, β-(trimethylsilyldimethylsilyl)ethyl (meth)acrylate, and β-(trimethoxysilyldimethylsilyl)ethyl (meth)acrylate.

The silicon-atom-containing polymerizable monomer having no acid-cleavable group may include allyl compounds, vinyl compounds, (meth)acryloyl-group-containing compounds and styrene compounds which all contain a silicon atom and have no acid-cleavable group.

Stated specifically, the silicon-atom-containing allyl compounds having no acid-cleavable group may include, e.g., allyldimethylsilane, 2-allyloxyethylthiomethyltrdimethylsilane, allyltriisopropylsilane, allyltrimethylsilane, allyltriphenylsilane, diallyldimethylsilane, diallyldiphenylsilane, diallylmethylphenylsilane, 1,3-diallyltetramethyldisiloxane. (3,3-dimethylallyl)trimethylsilane, (1-hydroxylallyl)trimethylsilane, tetraallylsilane, 3-(N-allylamino)propyltrimethoxysilane, allylaminotrimethylsilane, allyldimethoxysilane, allyldimethyl(diisopropylamino)silane, o-allyloxy(polyethyleneoxy)trimethylsilane, allyloxytrimethylsilane, 1-allyl-1,1,3,3-tetramethyldisiloxane, allyltriethoxysilane, allyltrimethoxysilane, allyltris(trimethylsiloxy)silane, 1,3-diallyltetrakis(trimethylsiloxy)siloxane, and allyltrimethylsilane.

The silicon-atom-containing vinyl compounds having no acid-cleavable group may include, e.g., vinyltris(trimethylsiloxy)silane, 3-aminophenoxydimethylvinylsilane, 4-aminophenoxydimethylvinylsilane, dimethylpiperidinomethylvinylsilane, diphenyldivinylsilane, divinyldimethylsilane, 1,5-divinyl-3,3-diphenyl-1,1,5,5-tetramethyltrisiloxane, 1,5-divinylhexamethyltrisiloxane, divinyltetramethyldisiloxane, 1,3-divinyltetramethyldisiloxane, 1,4-divinyltetramethyldisilylethane, divinyltetraphenyldisiloxane, hexavinyldisiloxane, methoxydimethylvinylsilane, (2,4-pentadienyl)trimethylsilane, tetrakis(vinyldimethylsiloxy)silane, 1,1,3,3-tetravinyldimethyldisiloxane, tetravinylsilane, 1,3,5,7-tetravinyl-1,3,5,7-tetramethylcyclotetrasiloxane, tris(1-methylvinyloxy)vinylsilane, 1,3,5-trivinyl-1,1,3,5,5-pentamethyltrisiloxane, trivinylsilane, vinyl-t-butyldimethylsilane, vinyldiethylmethylsilane, vinylmethylbis(trimethylsiloxy)silane, vinylmethylsilacyclopentane, vinylpentamethyldisiloxane, vinylphenyldimethylsilane, vinylphenylmethylsilane, vinyltriethylsilane, vinyltriisopropenoxysilane, vinyltriisopropoxysilane, vinyltrimethylsilane, vinyltriphenylsilane, vinyltris(dimethylsiloxy)silane, bis(dimethylamino)vinylethylsilane, bis(dimethylamino)vinylmethylsilane, diethoxdivinylsilane, 1,3-divinyltetraethoxydisiloxane, (1-methoxyvinyl)trimethylsilane, trivinylethoxysilane, trivinylmethoxysilane, vinyldimethylethoxysilane, vinyldiphenylethoxysilane, vinylethyldimethylsilane, vinylmethylacetoxysilane, vinylmethyldiethoxysilane, vinylmethyldimethoxysilane, vinyloxytrimethylsilane, vinyltriacetoxysilane, vinyltri-t-butoxysilane, vinyltriethoxysilane, vinyltrimethoxysilane, vinyltriphenoxysilane, and vinyltris(2-methoxyethoxy)silane.

The silicon-atom-containing (meth)acryloyl-group-containing compounds having no acid-cleavable group may include, e.g., (3-acryloxypropyl)dimethyltrimethoxysilane, (3-acryloxypropyl)methylbis(trimethylsiloxy)silane, (3-acryloxypropyl)methyldimethoxysilane, (3-acryloxypropyl)trimethoxysilane, (3-acryloxypropyl)tris(trimethylsiloxy)silane, acryloxytrimethylsilane, bis(2-allyloxymethyl-1-trimethylsiloxybutane, bis(methacryloxy)diphenylsilane, 1,3-bis(3-methacryloxypropyl)tetramethyldisiloxane, 1,3-bis(methacryloxy)-2-trimethylsiloxypropane, ethyl-3-(trimethylsilyl)propinoate, methacrylamidopropyltriethoxysilane, methacrylamidotrimethylsilane, methacryloxyethoxytrimethylsilane, (methacryloxymethyl)bis(trimethylsiloxy)methylsilane, (methacryloxymethyl)dimethylethoxysilane, (methacryloxymethyl)phenyldimethylsilane, methacryloxymethyltriethoxysilane, methacryloxymethyltrimethoxysilane, methacryloxymethyltrimethylsilane, methacryloxymethyltris(trimethylsiloxy)silane, 3-methacryloxypropylbis(trimethylsiloxy)methylsilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylpentamethyldisiloxane, methacryloxypropyltriethoxysilane, methacryloxypropyltris(trimethylsiloxy)silane, methacryloxypropyltris(vinyldimethylsiloxy)silane, methacryloxytrimethylsilane, methyl-3-(trimethylsiloxy)crotonate, methyl(1-trimethylsilyl)acrylate, tetrakis(2-methacryloxyethoxy)silane, and trimethylsilyl propionate.

The silicon-atom-containing styrene compounds having no acid-cleavable group may include, e.g., p-(t-butyldimethylsiloxy)styrene, styrylethyltrimethoxysilane, and (m,p-divinylbenzyloxy)trimethylsilane.

In addition, also usable as the silicon-atom-containing monomer having no acid-cleavable group are alkene compounds such as silacyclopentene, 3-(trimethylsilyl)cyclopentene, 1,1-diethoxy-1-silacyclopent-3-ene, tetaallyloxysilane, 1-methoxy-1-(trimethylsiloxy)-2-methyl-1-propene, (2-methyl-propenyl)trimethoxysilane, 2-methyl-1-trimethylsiloxy)-1-propene, 1-(trimethylsiloxy)-1,3-butadiene, 2-(trimethylsiloxy)-1,3-butadiene, and bis(trimethylsilyl)itaconate; and alkyne compounds such as 1-trimethylsilylpropagyl alcohol, bis(trimethylsilyl)acetylene, ethynyltriethylsilane, ethynyltrimethylsilane, 1-heptynyltrimethylsilane, 1-trimethylsilylbute-1-in-3-ol, 1-trimethylsilyl-1-hexyne, trimethylsilylpropyne, bis(trimethylsilyl)acetylene dicarboxylate, 1,3-diethynyl-1,1,3,3-tetramethyldisiloxane, dimethylethoxyethynylsilane, dimethylisopentyloxyvinylsilane, and propagyloxytrimethylsilane.

In the production of the component-(C) acid-cleavable-group-containing resin, the polymerization or copolymerization of the polymerizable unsaturated monomer having an acid-cleavable group may be carried out by suitable polymerization such as bulk polymerization, solution polymerization, precipitation polymerization, emulsion polymerization, suspension polymerization or bulk-suspension polymerization under appropriate selection of a polymerization initiator or polymerization catalyst such as a radical polymerization initiator, an anionic polymerization catalyst, a coordination anionic polymerization catalyst or a cationic polymerization catalyst in accordance with the types of monomers and reaction mediums. Also, the polycondensation or copolycondensation of the polycondensation component having an acid-cleavable group may be carried out in an aqueous medium or in a mixed medium comprised of water and a hydrophilic solvent, in the presence of an acid catalyst.

Into the component-(C) acid-cleavable-group-containing resin, a branched structure may be introduced using a polyfunctional monomer having at least two polymerizable unsaturated bonds. Such a polyfunctional monomer may include, e.g., polyfunctional (meth)acrylates as disclosed in Japanese Laid-open Publication (Kokai) No. 8-316888 and polyfunctional aromatic vinyl compounds such as divinylbenzene and diisopropenylbenzene.

The polyfunctional monomer may be used alone or in the form of a mixture of two or more types.

Where, e.g., di(meth)acrylate of 1,1-dimethylethylene glycol is used as the polyfunctional monomer, an acid-cleavable branched structure represented by the following formula (9) is introduced into the component-(C) acid-cleavable-group-containing resin.

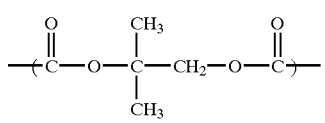

(9)

Where the component-(C) acid-cleavable-group-containing resin has a phenolic hydroxyl group, a branched structure attributable to an acetal-type cross-linking agent can be introduced into the component-(C) acid-cleavable-group-containing resin by allowing the phenolic hydroxyl group with at least one divinyl ether compound. The divinyl ether compound which provides such a branched structure may include ethylene glycol divinyl ether, diethylene glycol divinyl ether and cyclohexane-1,4-dimethanol divinyl ether.

As an example of the branched structure attributable to an acetal-type cross-linking agent, it may include an acid-cleavable branched structure represented by the following formula (10).

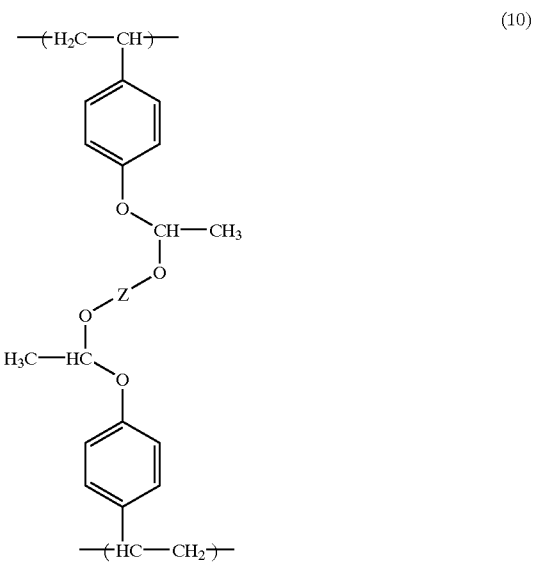

(10)

In the formula (10), Z represents a divalent organic group.

As examples of the divalent organic group represented by Z, it may include the following.

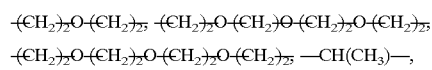

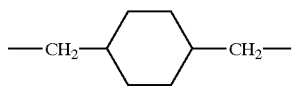

The percentage of introduction of the polyfunctional monomer and/or the branched structure attributable to an acetal-type cross-linking agent into the component-(C) acid-cleavable-group-containing resin depends on the types of the branched structure and the component-(C) acid-cleavable-group-containing resin into which it is to be introduced, and can not absolutely be defined. It may preferably be not more than 10 mol % based on all the repeating units.

The component-(C) acid-cleavable-group-containing resin may have the following weight-average molecular weight (hereinafter "Mw") in terms of polystyrene as measured by gel permeation chromatography.

In the case of the component-(C) acid-cleavable-group-containing resin having no branched structure, it may preferably have an Mw of from 1,000 to 150,000, and more preferably from 3,000 to 100,000.

In the case of the component-(C) acid-cleavable-group-containing resin having a branched structure, it may also preferably have an Mw of from 5,000 to 500,000, and more preferably from 8,000 to 300,000.

In the present invention, the component-(C) acid-cleavable-group-containing resin may be used alone or in the form of a mixture of two or more types.

Preparation of Composition

Mixing proportion of the respective components that constitute the positive radiation-sensitive resin composition of the present invention may vary in accordance with the desired characteristics of resists. To show preferable mixing proportions, they are as follows:

First, in the present invention, the component-(A) compound may be mixed in an amount of from 0.001 to 15 parts by weight, preferably from 0.005 to 10 parts by weight, and particularly preferably from 0.01 to 3 parts by weight, based on 100 parts by weight of the component-(C) acid-cleavable-group-containing resin. Here, if the component-(A) compound is mixed in an amount less than 0.001 part by weight, the resultant composition tends to have low resolution and cause a deterioration of pattern shape. If on the other hand it is more than 15 parts by weight, the resultant composition tends to have low sensitivity and developability.

The component-(B) acid generator may also be mixed in an amount of from 0.01 to 70 parts by weight, preferably from 0.1 to 50 parts by weight, and particularly preferably from 0.5 to 20 parts by weight, based on 100 parts by weight of the component-(C) acid-cleavable-group-containing resin. Here, if the component-(B) acid generator is mixed in an amount less than 0.01 part by weight. the resultant composition may have low sensitivity and resolution. If on the other hand it is more than 70 parts by weight, resist coating performance and pattern shape tend to deteriorate.

To show the mixing proportions of the respective components more specifically, the component-(A) compound is in an amount of from 0.001 to 15 parts by weight; the component-(B) acid generator, from 0.01 to 70 parts by weight; and the component-(C) acid-cleavable-group-containing resin, 100 parts by weight. More preferably, the component-(A) compound is in an amount of from 0.005 to 10 parts by weight; the component-(B) acid generator, from 0.1 to 50 parts by weight; and the component-(C) acid-cleavable-group-containing resin, 100 parts by weight. Still more preferably, the component-(A) compound is in an amount of from 0.01 to 3 parts by weight; the component-(B) acid generator, from 0.5 to 20 parts by weight; and the component-(C) acid-cleavable-group-containing resin, 100 parts by weight.

Additives

In the positive radiation-sensitive resin composition of the present invention, various additives such as an acid diffusion control agent other than the component-(A) compound (hereinafter "additional acid diffusion control agent"), a surface-active agent and a sensitizer may optionally be mixed.

Such an additional acid diffusion control agent may include, e.g., compounds represented by the following formula (11):

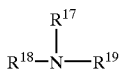

(11)

[In the formula (11), $R^{17}$, $R^{18}$ and $R^{19}$ each independently represent a hydrogen atom, a straight-chain, branched or cyclic alkyl group aryl, group or aralkyl group, and these alkyl group, aryl group and aralkyl group may be substituted] (hereinafter "nitrogen-containing compound (I')"), compounds having two nitrogen atoms in the same molecule (hereinafter "nitrogen-containing compound (II')"), compounds having three or more nitrogen atoms (hereinafter "nitrogen-containing compound (III')"), amide-group-containing compounds, urea compounds, and nitrogen-containing heterocyclic compounds.

The nitrogen-containing compound (I') may include, in addition to those exemplified for the amino compound (a), e.g., trialkylamines such as triethylamine, tri-n-propylamine, tri-n-butylamine, tri-n-pentylamine, tri-n-hexylamine, tri-n-heptylamine, tri-n-octylamine, tri-n-nonylamine and tri-n-decylamine; and alkanolamines such as ethanolamine, diethanolamine and triethanolamine.

The nitrogen-containing compound (II') may include, in addition to those exemplified for the amino compound (a), e.g., N,N,N',N'-tetramethylethylenediamine, N,N,N',N'-tetrakis(2-hydroxyethyl)ethylenediamine, and N,N,N',N'-tetrakis(2-hydroxypropyl)ethylenediamine.

The nitrogen-containing compound (III')may include, in addition to those exemplified for the amino compound (a), e.g., polymers such as polyethyleneimine and N-(2-dimethylaminoethyl)acrylamide.

The amide-group-containing compounds may include, in addition to those exemplified for the amino compound (a), e.g., N,N-dimethylformamide, N,N-dimethylacetamide and N-methylpyrrolidone.

The urea compounds may include, in addition to those exemplified for the amino compound (a), e.g., 1,1,3,3-tetramethylurea.

The nitrogen-containing heterocyclic compounds may include, in addition to those exemplified for the amino compound (a), e.g., pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 8-oxaquinoline and acrydine; and besides pyrazine, pyridazine, quinozaline, 4-methylmorpholine and 1,4-diazabicyclo[2.2.2]octane.

Of these additional acid diffusion control agents, the nitrogen-containing compound (I'), the nitrogen-containing compound (II') and the nitrogen-containing heterocyclic compound are preferred.

The additional acid diffusion control agent may be used alone or in the form of a mixture of two or more types.

The additional acid diffusion control agent may usually be mixed in an amount not more than 90% by weight, preferably not more than 70% by weight, and particularly preferably not more than 50% by weight, based on the total weight of the component-(A) compound and additional acid diffusion control agent. Here, if the additional acid diffusion control agent is mixed in an amount more than 90% by weight, the intended effect of the present invention may be damaged.

The surface-active agent has the action to improve the coating performance, storage stability, developability and so forth of the radiation-sensitive resin composition. Such a surface-active agent includes anionic, cationic, nonionic and amphoteric types, any of which may be used. Preferred surface-active agents are nonionic surface-active agents.

As examples of the nonionic surface-active agents they may include polyoxyethylene higher alkyl ethers, polyoxyethylene higher alkyl phenyl ethers, polyethylene glycol higher fatty acid diethers, and besides a series of products with trade names such as KP (available from Shin-Etsu Chemical Co.. Ltd.), POLYFLOW (available from Kyoueisha Chemical Co., Ltd.), F-TOP (available from Mitsubishi Material Co.), MEGAFACK (available from Dainippon Ink & Chemicals, Inc.), FLUORAD (available from Sumitomo 3M Limited), and ASAHI GUARD and SURFLON (available from Asahi Glass Co., Ltd.

Any of these surface-active agents may be used alone or in the form of a mixture of two or more types.

The surface-active agent may usually be mixed in an amount not more than 2 parts by weight as an effective component of the surface-active agent, based on 100 parts by weight of the total resin components in the radiation-sensitive resin composition.

The sensitizer shows the action to absorb the energy of radiations and transmit the absorbed energy to the component-(B) acid generator to cause the acid to be generated in a large quantity, and has the effect of improving apparent sensitivity of the radiation-sensitive resin composition.

Preferred sensitizers are acetophenones, benzophenones, naphthalenes, biacetyl, eosine, Rose Bengale, pyrenes, anthracenes and phenothiazines. Any of these sensitizers may be used alone or in the form of a mixture of two or more types. The sensitizer may usually be mixed in an amount not more than 50 parts by weight, and preferably not more than 30 parts by weight, based on 100 parts by weight of the total resin components in the radiation-sensitive resin composition.

A dye and/or a pigment may also be mixed so that latent images at exposed areas can be rendered visible and any influence of halation can be lessened at the time of exposure, and an adhesion aid may be mixed so as to improve adhesion to substrates.

As other additives, they may further be halation preventive agents, storage stabilizers, anti-foaming agents and shape improvers, which may specifically include 4-hydroxy-4'-methylcalcon.

Solvents

The positive radiation-sensitive resin composition of the present invention is, when used, dissolved in a solvent so as to be in a solid concentration of, e.g., from 2 to 50% by weight, followed by filtration with a filter having a pore size of, e.g., about 0.2 µm, and prepared into composition solutions.

The solvent may include, e.g., ethers, esters, ether esters, ketone esters, ketones, amides, amide esters, lactams, lactones, and (halogenated) hydrocarbons, and may more specifically include ethylene glycol monoalkyl ethers, diethylene glycol dialkyl ethers, propylene glycol monoalkyl ethers, propylene glycol dialkyl ethers, ethylene glycol monoalkyl ether acetates, propylene glycol monoalkyl ether acetates, acetates, hydroxyacetates, alkoxyacetates, acetoacetates, propionates, lactates, alkoxypropionates, butyrates, piruvates, cyclic or non-cyclic ketones, N,N-dialkylformamides, N,N-dialkylacetamides, N-alkylpyrrolidones, γ-lactones, aliphatic or halogenated aliphatic hydrocarbons, and aromatic or halogenated aromatic hydrocarbons.

As specific examples of such solvents, they may include ethylene glycol monomethyl ether, ethylene glycol mono-ethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, propylene glycol monomethyl ether acetate, propylene glycol monoethyl ether acetate, propylene glycol mono-n-propyl ether acetate, ethyl acetate, n-propyl acetate, n-butyl acetate, isopropenyl acetate, 3-methoxybutyl acetate, 3-methyl-3-methoxybutyl acetate, ethyl hydroxyacetate, ethyl ethoxyacetate, methyl acetoacetate, ethyl acetoacetate, isopropenyl propionate, 3-methyl-3-methoxybutyl propionate, ethyl lactate, ethyl 2-hydroxy-2-methylpropionate, methyl 3-methoxypropionate, ethyl 3-methoxypropionate, methyl 3-ethoxypropionate, ethyl 3-ethoxypropionate, 3-methyl-3-methoxybutyl butyrate, methyl 2-hydroxy-3-methylbutyrate, methyl ethyl ketone, cyclohexanone, 2-heptane, 3-heptane, 4-heptane, N,N-dimethylformamide, N,N-dimethylacetamide, N-methylpyrrolidone, toluene, and xylene.

Of these solvents, propylene glycol monoalkyl ether acetates, lactates, 3-alkoxypropionates and cyclic or non-cyclic ketones are preferred.

The above solvents may be used alone or in the form of a mixture of two or more types.

To the above solvent, at least one high-boiling point solvent may optionally be added, such as benzyl ethyl ether, di-n-hexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, y-butylolactone, ethylene carbide, propylene carbide, and ethylene glycol monophenyl ether acetate.

Formation of a Patterned Multilayer Resist Film

When patterned resist films are formed using the positive radiation-sensitive resin composition of the present invention, a resin solution for lower-layer resists which is comprised of a novolak resin, a polyhydroxystyrene derivative or an acrylic resin may previously be coated on, e.g., substrates such as silicon wafers or wafers covered with aluminum, by spin coating, cast coating or roll coating, followed by heat treatment to form lower-layer organic films. On the films thus formed, a solution of the silicon-atom-containing resin composition of the present invention, prepared as described previously, may be coated by spin coating, cast coating or roll coating to form upper-layer resist films, further followed by heat treatment (hereinafter this heat treatment is called "PB"), and then the resist films are subjected to exposure through given mask patterns. As radiations usable for the exposure, mercury lamp bright-line spectra (wavelength: 254 nm) and far-ultraviolet radiations of KrF excimer laser (wavelength: 248 nm) or ArF excimer laser (wavelength: 193 nm) are preferred. Depending on the type of the component-(B) acid generator, radiations of F2 excimer laser (wavelength: 157 nm), X-radiations such as synchrotron radiations, and charged-particle radiations such as electron radiations may also be used. Also, exposure conditions such as radiation dose may appropriately be selected in accordance with the mixing formulation and additives for the radiation-sensitive resin composition.

After exposure, heat treatment to improve apparent sensitivity of resists (this heat treatment is hereinafter called "PEB") may preferably be made. Heating conditions therefor may vary depending on the mixing formulation and additives for the radiation-sensitive resin composition. Usually, the heating may be at a temperature of from 30 to 200° C., and preferably from 50 to 150° C.

Thereafter, the resist is developed with an alkaline developing solution to form a stated patterned resist film.

As the alkaline developing solution, usable are, e.g., alkaline aqueous solutions prepared by dissolving at least one of alkaline compounds such as alkali metal hydroxides, ammonia water, alkylamines, alkanolamines, heterocyclic amines, tetraalkylammonium hydroxides, choline, 1,8-diazabicyclo[5.4.0]-7-undecene and 1,5-diazabicyclo[4.3.0]-5-nonene so as to be in a concentration of usually from 1 to 10% by weight, and preferably from 2 to 5% by weight. Particularly preferred alkaline developing solutions are aqueous solutions of tetraalkylammonium hydroxides.

To developing solutions formed of such alkaline aqueous solutions, water-soluble organic solvents or surface-active agents as exemplified by methanol and ethanol may also be added in appropriate quantity. Incidentally, when such developing solutions formed of alkaline aqueous solutions are used, it is common to carry out water washing after the development. In the production of devices, the lower-layer organic films are further processed by a method such as dry etching or wet etching, using the upper-layer patterned resist film as a mask.

EXAMPLES

The present invention will be described below in greater detail by giving Examples. The present invention, however, should by no means be construed limitative by these Examples. Here, the upper-layer resist described in the present invention was evaluated in the following way.

Sensitivity

The amount of exposure that forms a line-and-space pattern (1L1S) of 0.20 µm in design size in a line width of 1:1 was regarded as optimum amount of exposure. Sensitivity was evaluated by this optimum amount of exposure.

Resolution

Minimum size (µm) of a line-and-space pattern (1L1S) of 0.20 µm in design size resolved when exposed at the optimum amount of exposure was regarded as resolution (1L1S).

Storage Stability

The results of evaluation of resists formed using composition solutions stored at 23° C. for 6 month after preparation was compared with the results of evaluation of resists formed using composition solutions immediately after preparation. A case in which no change was seen in resolution and pattern shape and also the rate of change in the optimum amount of exposure for the line-and-space pattern (lL1S) of 0.20 µm in design size was less than ±2% was evaluated as "O"; a case in which no change was seen in resolution and pattern shape and also the rate of change in the optimum amount of exposure for the line-and-space pattern (1L1S) of 0.20 µm in design size was +2% to ±5% was evaluated as "Δ"; and a case in which a change was seen in any one or more of resolution and pattern shape and also the rate of change in the optimum amount of exposure for the line-and-space pattern (1L1S) of 0.20 µm in design size was more than ±5% was evaluated as "×".

Components used in each Example and Comparative Example are as shown below.

[I] Positive radiation-sensitive resin composition for upper layer:

Acid Diffusion Control Agent

Component-(A) compound:
A-1: N-t-butoxycarbonyl-1-adamantylamine
A-2: N-t-butoxycarbonyldi-n-octylamine
A-3: N-t-butoxycarbonyldicyclohexylamine
A-4: N-t-butoxycarbonyl-4,4'-diaminodiphenylmethane
A-5: N-t-butoxycarbonyl-2-phenylbenzimidazole Other compound (additional acid diffusion control agent):
a-1: Methyldicyclohexylamine Component-(B) Acid Generator
B-1: N-(trifluoromethanesulfonyloxy)bicyclo-[2.2.1]hepto-5-ene-2,3-dicarboxyimide
B-2: N-{(5-methyl-5-carboxymethanebicyclo-[2.2.1]heptan-2-yl)sulfonyloxy}succinimide.
B-3: N-(10-camphorsulfonyloxy)succinimide
B-4: Bis(4-t-butylphenyl)iodonium 10-camphor sulfonate
B-5: Triphenylsufonium trifluoromethane sulfonate
B-6: Triphenylsufonium nonafluoro-n-butane sulfonate
B-7: Bis(cyclohexanesulfonyl)diazomethane Component-(C) Acid-cleavable-group-containing Resin
C-1: t-Butoxystyrene/tris(trimethoxysilyl)silyl acrylate/4-hydroxystyrene copolymer (copolymerization molar ratio=15:15:70, Mw=15,000)
C-2: t-Butoxystyrene/β-tris(trimethylsilyl)silylethyl methacrylate/4-hydroxystyrene copolymer (copolymerization molar ratio=15:20:65, Mw=9,000)
C-3: Maleic anhydride/t-butyl acrylate/allyltrimethylsilane copolymer (copolymerization molar ratio=50:25:25, Mw=20,000)

Solvent
S-1: Ethyl lactate
S-2: Ethyl 3-ethoxypropionate
S-3: Propylene glycol monomethyl ether acetate
S-4: 2-Heptane

[II] Resin composition for lower layer:
U-1: DUV30, available from Brewer Science Co.
U-2: Novolak Resist IX410H, available from JSR Corporation
U-3: Polyhydroxystyrene derivative resin solution (formulated as shown below)
  4-Hydroxystyrene/9-vinylanthracene copolymer (copolymerization molar ratio=85:15, Mw=8,000) parts by weight
  Dimethoxyurea (trade name: MX290; available from Sanwa Chemical Co., Ltd.) 3 parts by weight
  Diphenylmethylsulfonium trifurate 1 part by weight
  Ethyl lactate 76 parts by weight

EXAMPLES 1 TO 11 & COMPARATIVE EXAMPLE 1

To prepare resin compositions for upper layers, ingredients shown in Table 1 ("pbw" stands for part(s) by weight) were mixed to form uniform solutions, which were then each filtered with a membrane filter of 0.2 µm in pore size. Resin compositions for lower layers were spin-coated on silicon wafers, followed by baking to form coating films. Thereafter, the resin compositions for upper layers, prepared previously, were spin-coated on the lower-layer coating films, and then PB was carried out under conditions shown in Table 2 to form resist films with a layer thickness of 0.2 µm.

Next, in Examples 1 to 9 and Comparative Example 1, exposure was carried out by means of a KrF excimer laser irradiation unit manufactured by Nikon K.K. (trade name: NSR2205 EX12B; numerical aperture: 0.55). In Example 10, exposure was carried out by means of an ArF excimer laser irradiation unit manufactured by Nikon K.K. (prototype; numerical aperture: 0.55) in a different exposure dose through a mask pattern. Also, in Example 11, exposure was carried out by means of a simple-structure electron radiation direct-drawing unit (accelerating voltage: 50 keV). Then, PEB was carried out under conditions shown in Table 2. Thereafter, using an aqueous 2.38% by weight tetramethylammonium hydroxide solution, the resists formed were developed by paddling at 23° C. for 1 minute, followed by washing with pure water for 30 seconds and then drying to form patterned resist films. Results of evaluation on each resist are shown in Table 3.

TABLE 1

|  | Acid diffusion control agent (pbw) | Acid generator (pbw) | | Acid-cleavable-group-containing resin (pbw) | | Solvent (pbw) | |
|---|---|---|---|---|---|---|---|
| Example 1 | A-3 0.20 | B-1 | 6 | C-1 | 100 | S-1 | 400 |
|  |  | B-2 | 3 |  |  | S-2 | 200 |
| Example 2 | A-1 0.25 | B-1 | 6 | C-1 | 100 | S-3 | 600 |
|  |  | B-3 | 3 |  |  |  |  |
| Example 3 | A-2 0.15 | B-1 | 8 | C-1 | 100 | S-4 | 550 |
| Example 4 | A-3 0.15 | B-1 | 4 | C-1 | 70 | S-1 | 400 |
|  | A-5 0.10 | B-4 | 2 | C-2 | 30 | S-3 | 200 |
| Example 5 | A-2 0.20 | B-5 | 3 | C-2 | 100 | S-1 | 600 |
|  | α-1 0.05 |  |  |  |  |  |  |
| Example 6 | A-2 0.15 | B-2 | 3 | C-1 | 100 | S-1 | 450 |
|  |  | B-6 | 3 |  |  | S-3 | 150 |
| Example 7 | A-1 0.25 | B-1 | 6 | C-2 | 100 | S-1 | 200 |
|  |  | B-7 | 1 |  |  | S-3 | 400 |
| Example 8 | A-3 0.20 | B-1 | 6 | C-3 | 100 | S-3 | 600 |
|  |  | B-6 | 2 |  |  |  |  |
| Example 9 | A-4 0.20 | B-1 | 7 | C-2 | 100 | S-1 | 500 |
|  |  | B-2 | 2 |  |  | S-3 | 100 |
| Example 10 | A-3 0.15 | B-5 | 3 | C-3 | 100 | S-1 | 400 |
|  |  |  |  |  |  | S-2 | 200 |
| Example 11 | A-3 0.10 | B-4 | 5 | C-1 | 100 | S-1 | 300 |
|  |  |  |  |  |  | S-2 | 300 |
| Comparative Example 1 | α-1 0.20 | B-1 | 6 | C-1 | 100 | S-1 | 400 |
|  |  | B-3 | 3 |  |  | S-2 | 200 |

TABLE 2 A

|  | Resin compositions for lower layer | Lower-layer film baking temperature (° C.) | Lower-layer film baking time (sec) | Lower-layer film layer thickness (μm) |
|---|---|---|---|---|
| Example 1 | U-1 | 175 | 60 | 0.055 |
| Example 2 | U-2 | 230 | 60 | 0.6 |
| Example 3 | U-2 | 230 | 60 | 0.6 |
| Example 4 | U-2 | 230 | 60 | 0.6 |
| Example 5 | U-2 | 230 | 60 | 0.6 |
| Example 6 | U-3 | 230 | 90 | 0.8 |
| Example 7 | U-1 | 175 | 60 | 0.055 |
| Example 8 | U-2 | 230 | 60 | 0.6 |
| Example 9 | U-2 | 230 | 60 | 0.6 |
| Example 10 | U-3 | 230 | 90 | 0.8 |
| Example 11 | U-2 | 230 | 60 | 0.6 |
| Comparative Example 1 | U-1 | 175 | 60 | 0.055 |

TABLE 2 B

|  | PB temperature (° C.) | PB time (sec) | Exposure light source | PEB temperature (° C.) | PEB time (sec) |
|---|---|---|---|---|---|
| Example 1 | 130 | 60 | KrF excimer laser | 130 | 60 |
| Example 2 | 130 | 60 | KrF excimer laser | 130 | 60 |
| Example 3 | 100 | 60 | KrF excimer laser | 110 | 90 |
| Example 4 | 130 | 60 | KrF excimer laser | 130 | 60 |
| Example 5 | 140 | 60 | KrF excimer laser | 140 | 60 |
| Example 6 | 90 | 60 | KrF excimer laser | 110 | 60 |
| Example 7 | 130 | 60 | KrF excimer laser | 120 | 60 |
| Example 8 | 130 | 60 | KrF excimer laser | 130 | 60 |
| Example 9 | 130 | 60 | KrF excimer laser | 130 | 60 |
| Example 10 | 130 | 60 | ArF excimer laser | 130 | 60 |
| Example 11 | 130 | 60 | Electron ray unit | 140 | 60 |
| Comparative Example 1 | 130 | 60 | KrF excimer laser | 130 | 60 |

TABLE 3

|  | Sensitivity | Resolution (μm) | Storage stability |
|---|---|---|---|
| Example 1 | 30 mJ/cm$^2$ | 0.17 | ○ |
| Example 2 | 25 mJ/cm$^2$ | 0.16 | ○ |
| Example 3 | 23 mJ/cm$^2$ | 0.16 | ○ |
| Example 4 | 28 mJ/cm$^2$ | 0.17 | ○ |
| Example 5 | 33 mJ/cm$^2$ | 0.16 | ○ |
| Example 6 | 21 mJ/cm$^2$ | 0.17 | ○ |
| Example 7 | 33 mJ/cm$^2$ | 0.16 | ○ |
| Example 8 | 26 mJ/cm$^2$ | 0.16 | ○ |
| Example 9 | 22 mJ/cm$^2$ | 0.17 | ○ |
| Example 10 | 29 mJ/cm$^2$ | 0.15 | ○ |
| Example 11 | 5 μC/cm$^2$ | 0.15 | ○ |
| Comparative Example 1 | 31 mJ/cm$^2$ | 0.17 | x Changed in optimum amount of exposure |

As described above, the radiation-sensitive resin composition of the present invention has superior sensitivity and resolution, can form fine patterns in a high precision and stably, and also has a superior storage stability without any change with time in sensitivity. Moreover, this radiation-sensitive resin composition can effectively be responsive to radiations of various types. Hence, the radiation-sensitive resin composition of the present invention is very useful especially as a resist used for the fabrication of semiconductor devices which are expected to be increasingly made finer. The composition is also useful as an upper-layer positive resist of multilayer resist films.

What is claimed is:

1. A positive-type radiation-sensitive resin composition comprising:
    (A) a low-molecular compound having at least one amino group having one or two hydrogen atoms bonded to a nitrogen atom wherein at least one hydrogen atom of said hydrogen atoms has been substituted with a t-butoxycarbonyl group;
    (B) a radiation-sensitive acid generator; and
    (C) an alkali-insoluble or alkali-slightly-soluble silicon-atom-containing resin having been protected with an acid-cleavable group, the resin being capable of turning alkali-soluble upon cleavage of the acid-cleavable group.

2. The radiation-sensitive resin composition according to claim 1, wherein said low-molecular compound prior to substitution with a t-butoxycarbonyl group in the definition of the component (A) is at least one compound selected from the group consisting of a compound represented by the following formula (1):

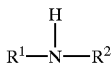
(1)

wherein $R^1$ and $R^2$ each independently represent a hydrogen atom or a monovalent organic group, provided that $R^1$ and $R^2$ are not hydrogen atoms at the same time, a compound having two nitrogen atoms in the molecule, a compound having three or more nitrogen atoms in the molecule, an amide-group-containing compound, a urea compound and a nitrogen-containing heterocyclic compound.

3. The radiation-sensitive resin composition according to claim 1, wherein the conjugate acid of said low-molecular compound prior to substitution with a t-butoxycarbonyl group in the definition of the component (A), has a pKa measured at 25° C. of 0 or more.

4. The radiation-sensitive resin composition according to claim 1, wherein the component-(A) low-molecular compound has a molecular weight of from 100 to 3,000.

5. The radiation-sensitive resin composition according to claim 1, wherein the component-(B) radiation-sensitive acid generator is an onium salt compound or a sulfonimide compound.

6. The radiation-sensitive resin composition according to claim 1, wherein the component-(C) silicon-atom-containing resin is a silicon-atom-containing resin having been formed by substituting a hydrogen atom of an acidic functional group contained in an alkali-soluble resin containing at least one repeating unit selected from the group consisting of the units represented by the following formulas (5) to (8):

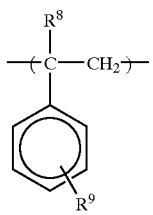
(5)

wherein in the formula (5), $R^8$ represents a hydrogen atom or a methyl group, $R^9$ represents a hydroxyl group, a carboxyl group, $-R^{10}COOH$, $-OR^{10}COOH$, $-OCOR^{10}COOH$ or $-COOR^{10}COOH$ (wherein $R^{10}$ represents $-(CH_2)_g-$, where g represents an integer of 1 to 4),

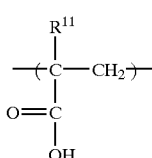
(6)

wherein in the formula (6), $R^{11}$ represents a hydrogen atom or a methyl group,

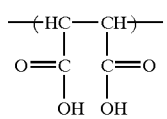
(7)

and,

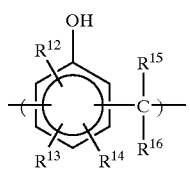
(8)

wherein in the formula (8), $R^{12}$ to $R^{16}$ each independently represent a hydrogen atom or an alkyl group having 1 to 4 carbon atoms, with at least one acid-cleavable group which is capable of cleaving in the presence of an acid.

7. The radiation-sensitive resin composition according to claim 1, wherein the acid-cleavable group in the component-(C) silicon-atom-containing resin is at least one acid-cleavable group selected from the group consisting of a substituted methyl group, a 1-substituted ethyl group, a 1-substituted n-propyl group, a 1-branched alkyl group, a silyl group, a germyl group, an alkoxycarbonyl group, an acyl group and a cyclic acid-cleavable group.

8. The radiation-sensitive resin composition according to claim 1, wherein the proportion of the number of acid-cleavable groups to the total number of acidic functional groups and acid-cleavable groups in the component-(C) is from 5% to 100%.

9. The radiation-sensitive resin composition according to claim 1, wherein the proportion of silicon atoms in the component-(C) silicon-atom-containing resin is from 0.1% by weight to 30% by weight.

10. The radiation-sensitive resin composition according to claim 1, wherein the component-(C) silicon-atom-containing resin is a copolymer of a polymerizable silicon-atom-containing monomer with at least one other monomer.

11. The radiation-sensitive resin composition according to claim 10, wherein said polymerizable silicon-atom-containing monomer is at least one monomer selected from the group consisting of a substituted silyl-group-containing styrene compound, a substituted silyl(meth)acrylate compound and a substituted silylalkyl(meth)acrylate compound, all of these compounds each having an acid-cleavable group.

12. The radiation-sensitive resin composition according to claim 10, wherein the polymerizable silicon-atom-containing monomer is at least one compound selected from the group consisting of allyl compounds, vinyl compounds, acryloyl group-containing compounds, methacryloyl group-containing compounds and styrene compounds, all of these compounds containing a silicon atom and having no acid-cleavable group.

13. The radiation-sensitive resin composition according to claim 1, wherein the component-(C) silicon-atom-containing resin is a resin derived from a polyfunctional monomer having at least two polymerizable unsaturated bonds.

14. The radiation-sensitive resin composition according to claim 1, wherein the component-(A) low-molecular compound is present in an amount of from 0.001 part by weight to 15 parts by weight based on 100 parts by weight of the component-(C) resin.

15. The radiation-sensitive resin composition according to claim 1, which further comprises as an acid diffusion control agent other than the component-(A) at least one compound selected from the group consisting of a compound represented by the following formula (1):

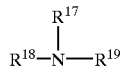
(11)

wherein $R^{17}$, $R^{18}$ and $R^{19}$ each independently represent a hydrogen atom, a linear, branched or cyclic alkyl group, aryl group or aralkyl group, and these alkyl group aryl group and aralkyl group may be substituted; a compound having two nitrogen atoms in the molecule; a compound having three or more nitrogen atoms in the molecule; an amide-group-containing compound; a urea compound; and a nitrogen-containing heterocyclic compound.

16. The radiation-sensitive resin composition according to claim 1, which further comprises as a solvent at least one member selected from the group consisting of a propylene glycol monoalkyl ether acetate, a lactate, a 3-alkoxypropionate, a non-cyclic ketone and a cyclic ketone.

17. The radiation-sensitive resin composition according to claim 1, which is used for formation of an upper-layer of a multilayer resist film.

18. A process for formation of a patterned resist film, comprising forming an organic film on a substrate, coating on the organic film the radiation-sensitive resin composition according to claim 1 to form a coating film, and exposing the coating film to radiation, followed by development.

* * * * *